United States Patent

Parmenter et al.

[11] Patent Number: 5,579,353
[45] Date of Patent: Nov. 26, 1996

[54] DYNAMIC CLOCK MODE SWITCH

[75] Inventors: Kevin C. Parmenter, Carrollton; Yutaka Takahashi, Dallas, both of Tex.

[73] Assignee: Texas Instruments Incorporated, Dallas, Tex.

[21] Appl. No.: 499,066

[22] Filed: Jul. 26, 1995

Related U.S. Application Data

[63] Continuation of Ser. No. 135,934, Oct. 12, 1993, abandoned.

[51] Int. Cl.⁶ .................................................... H03D 3/24
[52] U.S. Cl. .................... 375/376; 327/156; 331/DIG. 2
[58] Field of Search .................................. 375/372, 373, 375/374, 375, 376; 331/DIG. 2, 34, 1 R, 1 A, 58, 64; 327/156, 158, 159

[56] References Cited

U.S. PATENT DOCUMENTS

| | | | |
|---|---|---|---|
| 3,887,941 | 6/1975 | Dann et al. ...................... | 331/DIG. 2 |
| 5,184,350 | 2/1993 | Dara ................................. | 375/376 |
| 5,258,720 | 11/1993 | Tanis et al. ..................... | 375/120 |
| 5,260,979 | 11/1993 | Parker et al. ................... | 375/120 |
| 5,331,667 | 7/1994 | Izumi ............................... | 375/120 |

*Primary Examiner*—Stephen Chin
*Assistant Examiner*—Don Vo
*Attorney, Agent, or Firm*—J. Dennis Moore; James C. Kesterson; Richard L. Donaldson

[57] ABSTRACT

A dynamic clock mode switch (11) is provided for switching clock frequencies while allowing continuing operation of a depending system. The switch includes an enable circuit for transmitting an enable signal, a phase-locked loop circuit (PLL) (15) for locking onto an input clock frequency in response to said enable circuit, a PLL lock indicator for receiving a PLL lock signal (29) from said PLL, and a clock multiplexer with a multiplier for multiplying said input clock frequency by a predetermined factor in response to said enable circuit and PLL clock signals.

9 Claims, 2 Drawing Sheets

5,579,353

DYNAMIC CLOCK MODE SWITCH

This application is a Continuation, of application Ser. No. 08/135,934, filed Oct. 12, 1993 now abandoned.

NOTICE

Copyright ©, Texas Instruments Incorporated, 1993. A portion of the disclosure of this patent document contains material which is subject to copyright protection. The copyright owner has no objection to facsimile reproduction by anyone of the patent document or the patent disclosure, as it appears in the U.S. Patent and Trademark Office, patent file or records, but otherwise reserves all rights in its copyright whatsoever.

TECHNICAL FIELD OF THE INVENTION

This invention relates to dynamic clock mode systems and more particularly to a dynamic clock mode indicator for use with a phase-locked loop circuit.

BACKGROUND OF THE INVENTION

In the prior art, some processing systems have implemented more than one operating speed. In order to change operating modes, these systems have needed to stop execution by the CPU until a PLL has locked onto a desired clock signal. This has resulted in a loss of operating efficiency. Therefore, there has been a need for systems with an improved ability for transition between a first and second mode of operation; and, there has been a further need for systems with an ability to sense the particular operating mode of a dynamic operating mode system.

SUMMARY OF THE INVENTION

The present invention provides a dynamic clock mode switch for switching clock frequencies while allowing continuing operation of a depending system. The switch includes an enable circuit for transmitting an enable signal, a phase-locked loop circuit (PLL) for locking onto an input clock frequency in response to said enable circuit, a PLL lock indicator for receiving a PLL lock signal from said PLL, and a clock multiplexer with a multiplier for multiplying said input clock frequency by a predetermined factor in response to said enable and PLL clock signals.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

Figure 1:
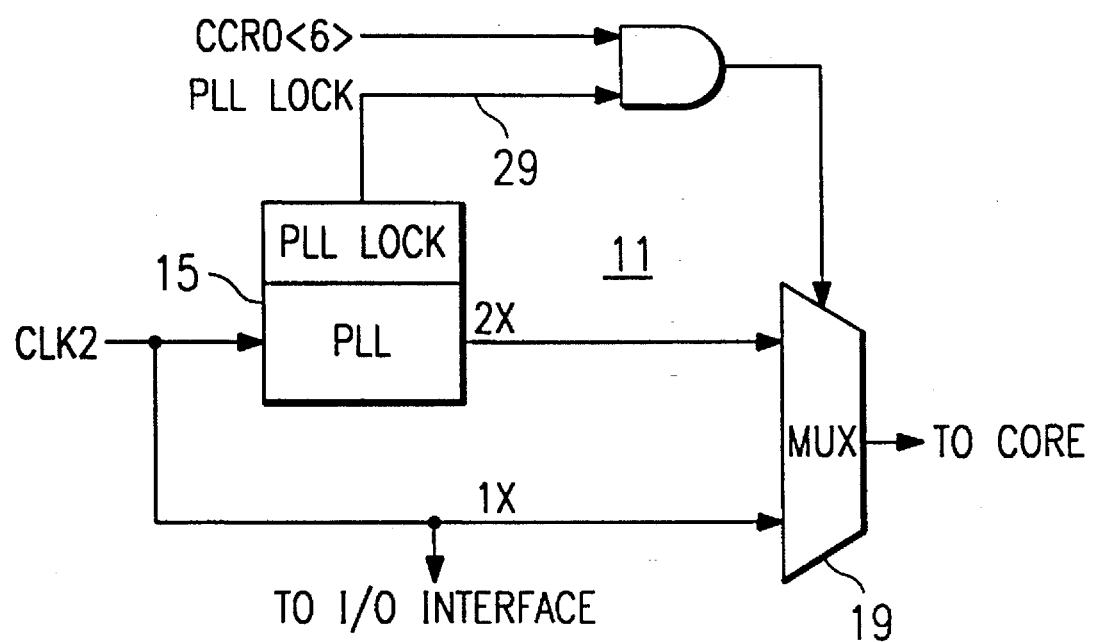
FIG. 1 is a block diagram of the preferred embodiment of a dynamic clock mode switch.
Figure 2:
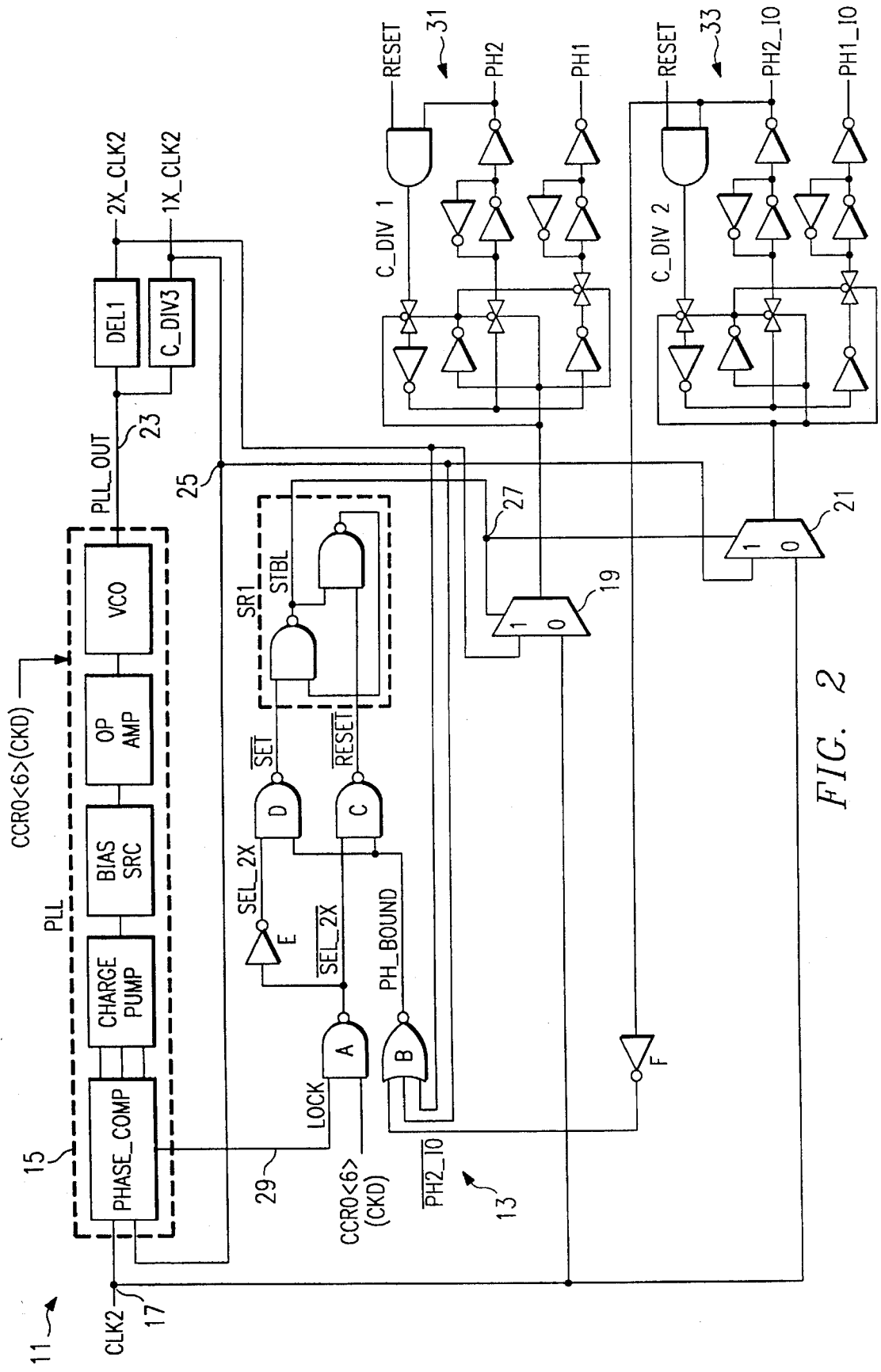
FIG. 2 is a schematic diagram of a PLL with the clock mode switch of the preferred embodiment.

Referring generally to FIG. 1, the preferred embodiment of a dynamic clock mode switch 11 is shown for switching clock frequencies while allowing continuing operation of a depending system shown in simplified from in FIG. 1, and in more detail in FIG. 2. The switch 11 includes a phase-locked loop circuit 15 (PLL) for locking onto 1X clock frequency in response to an enable signal, a PLL lock indicator 29 for receiving a PLL lock signal from the PLL, and a clock multiplexer 19 with multiple input frequencies for multiplying said input clock frequency by two in response to said enable and PLL clock signals.

The switch includes automatic clock reversion circuitry 13 for automatically switching to a 1X clock frequency when the PLL looses lock.

The clock multiplexer delays changing of clock modes with sensing a clock phase boundary in order to avoid a loss-of-state in the CPU.

Switch 11 receives a clock signal CLK2 at node 17 which is input to multiplexers 19, 21. Multiplexers 19, 21 receive as a second input signals 2X_CLK2 and 1X_CLK2 respectively. Multiplexers 19, 21 are activated by logic circuitry node 27 where the logic circuitry 13 receives as input the output signal from node 23, feedback signal from node 25, CKD enable signal and a PLL lock signal from line 29. Upon enablement multiplexers 19, 21 send output signals to divider circuitries 31, 33, respectively.

The current invention allows clock mode switching to occur dynamically depending on the PLL lock condition and clock-doubling enable bit. There are two signals which control the clock mode: a configuration register bit CCRO<6>, which is an enable bit, or signal, CKD, and a PLL lock indicator. When the enable bit CKD is set, the PLL begins to lock onto the input frequency. The PLL lock indicator will be low until a stable lock has been achieved, in which case it is driven high. When both signals are high, a S-R flip-flop SR1 is toggled upon the next stable clock state. The flip-flop output then switches a clock multiplexer 19 which clocks the core at twice the I/O frequency. The multiplexer 21 is provided to ensure minimum clock jitter between 1X clock generated by circuit 33 and 2X clock generated by circuit 31 by selecting 1X clock output from PLL 15 when in 2X mode.

The dynamic clock switch improves the 1X to 2X transition because the CPU continues to execute, clocked by CLK2, while the PLL is still in 1X mode, and still locking. This prevents extra CPU idle time during the lock time. The invention also prevents loss-of-state if the PLL looses lock, because the CPU will automatically switch back to 1X mode, and be clocked by CLK2. Another feature of the invention is the timing of the clock multiplexer switch. The control waits until the next clock phase boundary to change the clock mode. This prevents glitches and loss-of-state during mode transitions.

The CPU clock mode is selectable by an enable bit, CKD. The PLL lock indicator is also monitored by the control logic. The invention allows the CPU to continue executing instructions in 1X mode while the PLL is locking on to the input clock signal. When the PLL locks, the clock mode will automatically switch to 2X mode if the enable bit CKD is set. The invention prevents any idle CPU time while the PLL is in the locking stage. If the PLL looses lock for some reason, then the control logic will automatically switch to 1X mode while the PLL corrects the phase mismatch. The mode switch occurs on a clock phase boundary so no loss-of-state occurs.

The circuitry includes a PLL 15 for doubling the input clock frequency, a PLL lock indicator signal, LOCK delivered on line 29, a PH_bound signal to indicate clock switch condition, an STBL signal to switch the clock multiplexers 19 and 21, clock dividers C-DIV1 and C-DIV2, input clock CLK2, clock-double enable bit CKD, select indicator signal SEL_2X and !SEL_2X where "!" herein denotes inverse, i.e., the inverted form of the designated signal it precedes, clock divider C_DIV3 for dividing PLL output, 2X mode clocks 1X_CLK2 and 2X_CLK2, CPU clocks PH1, PH2, PH1_IO, PH2_IO, SR flip-flop SR1, logic gates A, B, C, D, E, F, SR1 controls !SET, !RESET, clock delay DEL1, PLL output PLL_OUT. Note that in the drawings, the inversion of a signal is indicated by a bar over the signal name.

In operation C_DIV1 accepts the output of multiplexer 19 and generates non-overlapping core clocks PH1 and PH2. C_DIV2 accepts the output of multiplexer 21 and generates non-overlapping I/O clocks PHI_IO and PH2_IO. Multiplexer 19 accepts STBL as a select signal, multiplexer 21 accepts STBL as a select signal, multiplexer 19 accepts 2X_CLK2 as its STBL=1 input, multiplexer 19 accepts CLK2 as its STBL=0 input, multiplexer 21 accepts 1X_CLK2 as its STBL=1 input, multiplexer 21 accepts CLK2 as its STBL=0 input. NOR gate B accepts !PH2_IO, 1X_CLK2, 2X_CLK2 and generates PH_BOUND. NAND gate A accepts LOCK and CKD signals and generates !SEL_2X. Inverter gate E accepts !SEL_2X and generates SEL_2X. NAND gate C accepts PH_BOUND, !SEL_2X and generates !RESET. NAND gate D accepts PH_BOUND, SEL_2X, and generates !SET. Inverter gate F accepts PH2_IO and generates !PH2_IO. SR1 accepts !SET and !Reset and generates STBL. PLL 15 accepts CLK2 and 1X_CLK2 and generates PLL_OUT. C_DIV3 accepts PLL OUT and generates 1X_CLK2. DEL1 accepts PLL_OUT and generates 2X_CLK2.

The PLL feedback is provided by a 50% duty cycle signal 1X_CLK2. PLL 15 is completely bypassed in 1X mode and CLK2 is used. In 2X mode, PLL provides 1X_CLK2 and 2X_CLK2 for dividers C_DIV1 and C_DIV2 inputs. The CPU and I/O clocks are outputs from the dividers, respectively.

In operation the following sequence occurs when the system requests 2X mode: the CPU executes in 1X CLK mode, software writes to register and sets CKD, PLL is activated and begins locking-on to CLK2, the CPU continues to execute in 1X mode, PLL locks and sets LOCK, SEL_2X goes high and !SEL_2X goes low, PH_BOUND goes high when !PH2_IO, 1X_CLK2, and 2X_CLK2 are low, !SET goes low, STBL goes high, multiplexer 19 selects 2X_CLK2, multiplexer 21 selects 1X_CLK2, C_DIV1 generates PH1, PH2 at the CLK2 frequency, and C_DIV2 generates PH1_IO, PH2_IO at half the CLK2 frequency.

In operation the following sequence occurs when the system requests 1X mode or the PLL looses LOCK: the CPU executes in 2X mode, software writes to register and resets CKD, PLL is deactivated and resets LOCK, SEL_2X goes low and !SEL-2X goes high, PH_BOUND goes high when !PH2_IO, 1X_CLK2, and 2X_CLK2 are low, !RESET goes low, STBL goes low, multiplexer 19 selects CLK2, multiplexer 21 selects CLK2, C_DIV1 generates PH1, PH2 at half the CLK2 frequency, and C_DIV2 generates PH1_IO, PH2_IO at half the CLK2 frequency.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A dynamic clock mode switch for switching clock frequencies in response to an enable signal, while allowing continuing operation of a depending system, said switch comprising:

a phase-locked loop circuit (PLL) for locking onto an input clock signal having a first frequency in response to said enable signal and for providing a first output clock signal, phase locked to said input clock signal, having a second frequency automatic clock switching means for providing said first output clock signal as the dynamic clock mode switch output clock signal, and for automatically switching to said input clock signal as the dynamic clock mode switch output clock signal when said PLL loses lock, but only at a subsequent clock phase boundary.

2. A switch as in claim 1, said automatic clock switching means changing clock modes upon sensing a clock phase boundary.

3. A dynamic clock mode switch for providing as an output clock signal either, as a default, an input clock signal, or, alternatively, in response to an enable signal, a derived clock signal, phase locked to said input clock signal, wherein said derived clock signal is provided as said output clock signal only so long as phase lock is maintained, comprising:

a phase-locked loop circuit (PLL) having said input clock signal as the input thereto which, in response to said enable signal, is enabled to lock onto said input clock signal and provide said derived clock signal, and which provides a lock signal indicating that phase lock has occurred; and automatic clock switching means for providing said derived clock signal as said output clock signal in response to said lock signal upon sensing that said input clock signal and said derived signal are at the same state.

4. A dynamic clock mode switch according to claim 3, further comprising means for automatically switching the dynamic clock mode switch output clock signal from said derived signal to said input clock signal when said PLL loses lock, but only after sensing that said input clock signal and said derived signal are at the same state.

5. A dynamic clock mode switch according to claim 3, wherein said automatic clock switching means further comprises means for deferring said providing of said derived clock signal as said output clock signal after said lock signal is received until the next stable clock state occurs.

6. A dynamic clock mode switch according to claim 5, wherein said means for deferring comprises means for sensing when both said input clock signal and said derived clock signal next transition in the same direction at the same time, and for providing said derived clock signal as said output clock signal when said sensing has occurred.

7. A dynamic clock mode switch according to claim 5, wherein said derived clock signal has a frequency that is a multiple of the frequency of said input signal.

8. A dynamic clock mode switch for switching an output clock signal between an input clock signal and a derived clock signal, phase locked to said input clock signal, comprising:

a phase-locked loop circuit (PLL) having said input clock signal as the input thereto capable of locking onto said input clock signal, providing said derived clock signal, and providing a lock signal indicating phase lock has occurred; and automatic clock switching means for switching from said input signal to said derived clock signal as said output clock signal upon receipt of said lock signal, and for switching from said derived signal to said input clock signal as said output clock signal upon loss of said lock signal, after sensing that said input clock signal and said derived signal are at the same state.

9. A dynamic clock mode switch in accordance with claim 1, wherein said phase-locked loop circuit provides a lock signal to said automatic clock switching means, and wherein, when such lock signal is lost, said automatic clock switching means automatically switches to said input clock signal.

* * * * *